US010559451B2

(12) United States Patent
Kalnin et al.

(10) Patent No.: US 10,559,451 B2
(45) Date of Patent: Feb. 11, 2020

(54) APPARATUS WITH CONCENTRIC PUMPING FOR MULTIPLE PRESSURE REGIMES

(71) Applicant: Applied Materials, Inc., Santa Clara, CA (US)

(72) Inventors: Nikolai Nikolaevich Kalnin, Santa Clara, CA (US); Toan Q. Tran, San Jose, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/433,008

(22) Filed: Feb. 15, 2017

(65) Prior Publication Data
US 2018/0233327 A1    Aug. 16, 2018

(51) Int. Cl.
*H01J 37/32*    (2006.01)
*C23C 16/44*    (2006.01)
(Continued)

(52) U.S. Cl.
CPC ...... *H01J 37/3244* (2013.01); *C23C 16/4408* (2013.01); *C23C 16/4412* (2013.01);
(Continued)

(58) Field of Classification Search
None
See application file for complete search history.

(56) References Cited

U.S. PATENT DOCUMENTS

| 4,178,964 A | * | 12/1979 | Moore | F16K 11/0655 |
| | | | | 137/606 |
| 4,438,049 A | * | 3/1984 | Ammons | F02M 3/075 |
| | | | | 123/339.1 |

(Continued)

FOREIGN PATENT DOCUMENTS

| JP | 5951095 B1 | * | 7/2016 | ....... C23C 16/45565 |
| KR | 20160148314 A | * | 12/2016 | ....... H01L 21/67253 |

(Continued)

OTHER PUBLICATIONS

U.S. Appl. No. 61/977,222. entitled "Symmetric Chamber Design for Variable Process Volume and Improved Flow Conductance and Uniformity," filed Apr. 9, 2014. in the names of Andrew Nguyen et al. pp. 1-38.. (Year: 2014).*

(Continued)

*Primary Examiner* — Jeffrie R Lund
*Assistant Examiner* — Stanislav Antolin
(74) *Attorney, Agent, or Firm* — Patterson + Sheridan, LLP

(57) ABSTRACT

An exhaust module for a substrate processing apparatus having a body, a pumping ring, and a symmetric flow valve, is disclosed herein. The body has a first and second vacuum pump opening formed therethrough. The pumping ring is positioned in the body over both the first and second vacuum pump openings. The pumping ring includes a substantially ring shaped body having a top surface, a bottom surface, and an opening. The top surface has one or more through holes formed therein, arranged in a pattern concentric with the first (Continued)

vacuum pump opening. The bottom surface has a fluid passage formed therein, interconnecting each of the one or more through holes. The opening is formed in the substantially ring shaped body, substantially aligned with the vacuum pump opening. The symmetric flow valve is positioned in the body over the pumping ring and movable between a raised position and a lowered position.

19 Claims, 8 Drawing Sheets

(51) Int. Cl.
    C23C 16/455      (2006.01)
    H01L 21/67       (2006.01)
    F16K 5/12        (2006.01)
    F16K 51/02       (2006.01)
    C23C 16/50       (2006.01)
    B01F 15/02       (2006.01)
    C23C 16/52       (2006.01)
    F04D 27/00       (2006.01)

(52) U.S. Cl.
    CPC .. *C23C 16/45502* (2013.01); *C23C 16/45589* (2013.01); *C23C 16/45591* (2013.01); *F16K 5/12* (2013.01); *F16K 51/02* (2013.01); *H01J 37/32009* (2013.01); *H01J 37/32633* (2013.01); *H01J 37/32715* (2013.01); *H01J 37/32834* (2013.01); *H01L 21/67017* (2013.01); *H01L 21/6719* (2013.01); *B01F 15/0264* (2013.01); *C23C 16/4409* (2013.01); *C23C 16/45587* (2013.01); *C23C 16/50* (2013.01); *C23C 16/52* (2013.01); *F04D 27/00* (2013.01); *H01J 37/32623* (2013.01); *H01J 2237/334* (2013.01)

(56) References Cited

U.S. PATENT DOCUMENTS

| | | | | |
|---|---|---|---|---|
| 4,779,649 A * | 10/1988 | Balter | F16K 3/186 | 137/630.12 |
| 5,114,316 A * | 5/1992 | Shimizu | F04B 37/085 | 417/423.4 |
| 5,205,918 A * | 4/1993 | Kinokiri | C23C 14/566 | 204/298.07 |
| 5,318,632 A * | 6/1994 | Onodera | C23C 16/4412 | 118/715 |
| 5,354,460 A * | 10/1994 | Kearney | B01D 3/008 | 210/198.2 |
| 5,441,568 A * | 8/1995 | Cho | C23C 16/4412 | 118/715 |
| 5,558,717 A * | 9/1996 | Zhao | C23C 16/4401 | 118/715 |
| 5,964,947 A | 10/1999 | Zhao et al. | | |
| 6,080,679 A * | 6/2000 | Suzuki | C23C 14/564 | 118/715 |
| 6,089,537 A * | 7/2000 | Olmsted | F16K 3/10 | 251/129.11 |
| 6,161,576 A * | 12/2000 | Maher | F04D 19/04 | 137/565.23 |
| 6,193,461 B1 * | 2/2001 | Hablanian | F04D 19/04 | 415/143 |
| 6,289,737 B1 * | 9/2001 | Kouketsu | G05D 16/024 | 73/714 |
| 6,409,149 B1 * | 6/2002 | Maher, Jr. | F16K 3/06 | 251/187 |
| 6,586,343 B1 * | 7/2003 | Ho | H01L 21/67017 | 118/719 |
| 6,598,615 B1 * | 7/2003 | Holland | H01J 37/32834 | 137/14 |
| 7,011,039 B1 * | 3/2006 | Mohn | H01J 37/321 | 118/723 R |
| 7,987,814 B2 | 8/2011 | Carducci et al. | | |
| 8,282,736 B2 | 10/2012 | Carducci et al. | | |
| 8,313,578 B2 | 11/2012 | Carducci et al. | | |
| 8,999,068 B2 * | 4/2015 | Honda | F04D 19/042 | 415/90 |
| 9,741,546 B2 * | 8/2017 | Carducci | F04D 19/042 | 415/65 |
| 2001/0032814 A1 * | 10/2001 | Kearney | B01D 15/14 | 210/284 |
| 2001/0042514 A1 * | 11/2001 | Mizuno | C23C 16/4412 | 118/728 |
| 2001/0052393 A1 * | 12/2001 | Okabe | C23C 16/4412 | 156/345.29 |
| 2002/0005167 A1 * | 1/2002 | Miyamoto | C23C 16/4412 | 118/715 |
| 2002/0017244 A1 * | 2/2002 | Sillmon | C23C 16/4412 | 118/715 |
| 2002/0045362 A1 * | 4/2002 | Yang | C23C 16/345 | 438/791 |
| 2002/0127508 A1 * | 9/2002 | Jin | C23C 16/4401 | 432/93 |
| 2002/0137312 A1 * | 9/2002 | Luo | C23C 16/4401 | 438/492 |
| 2002/0163637 A1 * | 11/2002 | Rossman | C23C 16/4404 | 356/237.4 |
| 2003/0094135 A1 * | 5/2003 | Komiya | C23C 16/4412 | 118/715 |
| 2003/0098066 A1 * | 5/2003 | Kanzaka | F16K 49/002 | 137/334 |
| 2003/0180495 A1 * | 9/2003 | Ito | B25B 11/005 | 428/64.4 |
| 2004/0118464 A1 * | 6/2004 | Chang | C23C 16/4412 | 137/630 |
| 2004/0124392 A1 * | 7/2004 | Lucas | F16K 51/02 | 251/251 |
| 2004/0134773 A1 * | 7/2004 | Pedersen | H01L 21/2885 | 204/212 |
| 2004/0187780 A1 * | 9/2004 | Park | C23C 16/4412 | 118/715 |
| 2004/0228747 A1 * | 11/2004 | Desbiolles | F04D 19/04 | 417/423.4 |
| 2005/0011459 A1 * | 1/2005 | Liu | C23C 16/45504 | 118/728 |
| 2005/0106005 A1 * | 5/2005 | Mokler | F04D 19/042 | 415/90 |
| 2005/0118013 A1 * | 6/2005 | Downham | F04D 23/008 | 415/55.1 |
| 2005/0121143 A1 | 6/2005 | Daugherty et al. | | |
| 2005/0150559 A1 * | 7/2005 | Kwon | F16K 3/32 | 137/630.12 |
| 2005/0196254 A1 * | 9/2005 | Kim | H01L 21/67017 | 414/217 |
| 2006/0034715 A1 * | 2/2006 | Boger | F04B 37/14 | 417/423.4 |
| 2006/0175012 A1 * | 8/2006 | Lee | C23C 16/4486 | 156/345.29 |
| 2006/0185743 A1 * | 8/2006 | Lucas | F16K 3/06 | 137/599.18 |
| 2006/0192170 A1 * | 8/2006 | Lucas | F16K 3/06 | 251/361 |
| 2006/0194435 A1 * | 8/2006 | Nishimura | H01L 21/0206 | 438/689 |
| 2006/0196527 A1 * | 9/2006 | Nishimura | G03F 7/423 | 134/2 |
| 2006/0225649 A1 * | 10/2006 | Courville | C23C 16/455 | 118/715 |
| 2006/0237136 A1 * | 10/2006 | Nguyen | F16K 1/22 | 156/345.29 |
| 2006/0257243 A1 * | 11/2006 | Moriya | F04D 19/042 | 415/90 |
| 2007/0051312 A1 * | 3/2007 | Sneh | C23C 14/566 | 118/719 |
| 2007/0084562 A1 | 4/2007 | Tsujimoto | | |

(56) References Cited

U.S. PATENT DOCUMENTS

| | | | |
|---|---|---|---|
| 2007/0138425 A1* | 6/2007 | Geiser | F16K 3/10 251/301 |
| 2007/0175393 A1* | 8/2007 | Nishimura | H01J 37/32192 118/715 |
| 2007/0207625 A1* | 9/2007 | Aggarwal | C23C 16/4412 438/758 |
| 2007/0228314 A1* | 10/2007 | Geiser | F16K 3/10 251/158 |
| 2008/0041821 A1* | 2/2008 | Gondhalekar | C23C 16/4558 216/67 |
| 2008/0176412 A1* | 7/2008 | Komeda | C23C 16/4412 438/778 |
| 2008/0178797 A1* | 7/2008 | Fodor | C23C 16/46 118/75 |
| 2008/0240905 A1* | 10/2008 | Sugawara | F04D 19/04 415/121.2 |
| 2008/0295867 A1* | 12/2008 | Poh | B08B 7/00 134/19 |
| 2008/0305632 A1* | 12/2008 | Nishimura | H01L 21/02063 438/680 |
| 2009/0035123 A1* | 2/2009 | Stones | F04D 19/044 415/72 |
| 2009/0060702 A1* | 3/2009 | Kobayashi | H01L 21/67017 414/805 |
| 2009/0120464 A1* | 5/2009 | Rasheed | C23C 16/4412 134/21 |
| 2009/0151872 A1* | 6/2009 | Samir | H01L 21/67017 156/345.48 |
| 2009/0159566 A1* | 6/2009 | Brillhart | C23C 14/505 216/58 |
| 2010/0032598 A1* | 2/2010 | Iwabuchi | F16K 1/2266 251/129.01 |
| 2010/0132891 A1* | 6/2010 | Nozawa | F16K 3/06 156/345.41 |
| 2010/0180426 A1* | 7/2010 | Huo | C23C 16/4401 29/527.1 |
| 2010/0192857 A1* | 8/2010 | Kobayashi | C23C 16/4412 118/723 R |
| 2010/0279008 A1* | 11/2010 | Takagi | C23C 16/4401 118/715 |
| 2010/0300483 A1* | 12/2010 | Kitaoka | C23C 16/4407 134/1.1 |
| 2011/0005680 A1* | 1/2011 | Balakrishna | C23C 16/4412 156/345.33 |
| 2011/0011338 A1* | 1/2011 | Chuc | C23C 16/452 118/715 |
| 2011/0042009 A1* | 2/2011 | Lee | H01J 37/3244 156/345.43 |
| 2011/0048453 A1 | 3/2011 | Honda et al. | |
| 2011/0290419 A1* | 12/2011 | Horiguchi | C23C 16/4412 118/715 |
| 2012/0009765 A1* | 1/2012 | Olgado | C23C 16/4401 432/93 |
| 2012/0111427 A1* | 5/2012 | Nozawa | C23C 16/4412 137/511 |
| 2012/0160417 A1* | 6/2012 | Lee | F16K 41/10 156/345.33 |
| 2012/0192793 A1* | 8/2012 | Fukumori | C23C 14/12 118/724 |
| 2012/0227830 A1* | 9/2012 | Eto | H01L 21/67253 137/67 |
| 2013/0019801 A1* | 1/2013 | Honma | C23C 16/402 118/719 |
| 2013/0087286 A1 | 4/2013 | Carducci et al. | |
| 2013/0174924 A1* | 7/2013 | Luo | F28F 9/0221 137/561 A |
| 2013/0337655 A1* | 12/2013 | Lee | H01J 37/32844 438/715 |
| 2014/0183390 A1* | 7/2014 | McPherson | F16K 3/34 251/157 |
| 2014/0209181 A1* | 7/2014 | Lucas | F16K 49/00 137/15.04 |
| 2014/0348634 A1* | 11/2014 | Bourrilhon | F04D 19/042 415/65 |
| 2015/0030766 A1* | 1/2015 | Lind | C23C 16/4412 156/345.29 |
| 2015/0059981 A1* | 3/2015 | Huston | H01J 37/32522 156/345.52 |
| 2015/0293527 A1* | 10/2015 | Nguyen | C23C 16/46 118/75 |
| 2016/0189987 A1* | 6/2016 | Amikura | H01L 21/67069 156/345.29 |
| 2016/0196963 A1* | 7/2016 | Saparqaliyev | H01F 7/02 417/48 |
| 2016/0289831 A1* | 10/2016 | Je | C23C 16/455 118/715 |
| 2016/0372347 A1* | 12/2016 | Kim | H01L 21/67253 |
| 2017/0067157 A1* | 3/2017 | Ashihara | C23C 16/45565 |

FOREIGN PATENT DOCUMENTS

| | | | |
|---|---|---|---|
| WO | WO-2012099579 A1 * | 7/2012 | H01L 21/67126 |
| WO | WO-2013098178 A1 * | 7/2013 | F04D 19/042 |
| WO | WO-2015012671 A1 * | 1/2015 | H01H 7/02 |
| WO | 2015156951 A1 | 10/2015 | |

OTHER PUBLICATIONS

International Search Report and Written Opinion for PCT/US2018/013627 dated May 3, 2018.

\* cited by examiner

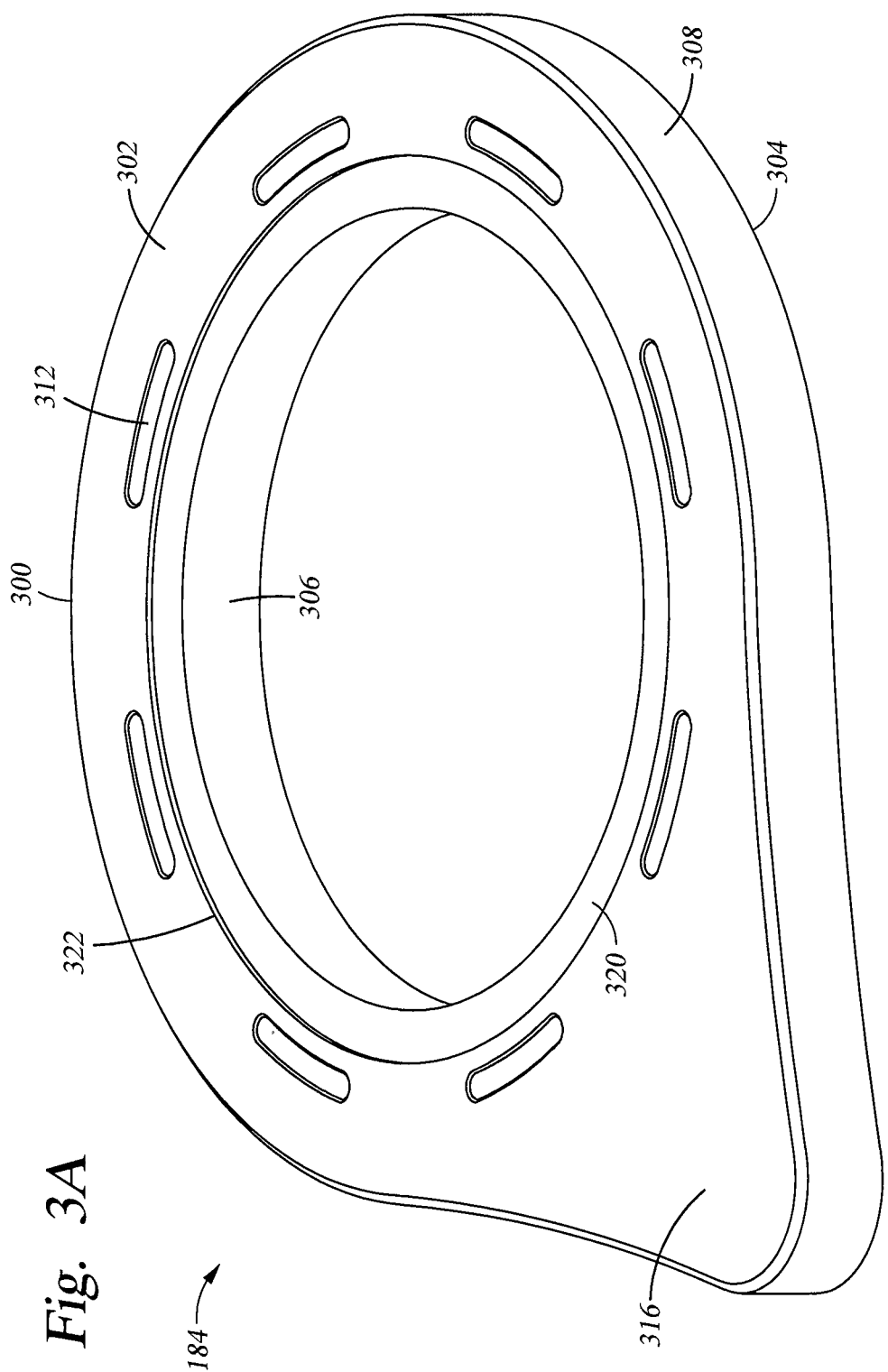

APPARATUS WITH CONCENTRIC PUMPING FOR MULTIPLE PRESSURE REGIMES

BACKGROUND

Field

Embodiments described herein generally relate to a substrate processing apparatus, and more specifically to an improved exhaust module for a substrate processing apparatus.

Description of the Related Art

Electronic devices, such as flat panel displays and integrated circuits, are commonly fabricated by a series of processes in which layers are deposited on a substrate and the deposited material is etched into desired patterns. The processes commonly include physical vapor deposition (PVD), chemical vapor deposition (CVD), plasma enhanced CVD (PECVD), and other plasma processing. Specifically, a plasma process includes supplying a process gas mixture to a vacuum chamber, and applying radio frequency power (RF power) to excite the process gas into a plasma state. The plasma decomposes the gas mixture into ion species that perform the desired deposition or etch processes.

As technology nodes progress, the need for increasingly smaller and selective etching capabilities are paramount. Therefore, there is a need for an improved processing chamber that enables variable process volume, improved flow conductance, and improved process uniformity which can be implemented for advanced technology nodes.

SUMMARY

Embodiments disclosed herein generally relate to an exhaust module for a substrate processing apparatus. The exhaust module includes a body, a pumping ring, and a symmetric flow valve. The body has a first vacuum pump opening and a second vacuum pump opening formed therethrough. The pumping ring is positioned in the body over both the first and second vacuum pump openings. The pumping ring includes a substantially ring shaped body having a top surface, a bottom surface, and an opening. The top surface has one or more through holes formed therein. The one or more through holes are arranged in a pattern concentric with the first vacuum pump opening. The bottom surface has a fluid passage formed therein. The fluid passage interconnects each of the one or more through holes. The opening is formed in the substantially ring shaped body. The opening is substantially aligned with the vacuum pump opening. The symmetric flow valve is positioned in the body over the pumping ring. The symmetric flow valve is movable between a raised position allowing for passage through the opening of the substantially ring shaped body and into the vacuum pump opening and a lowered position substantially sealing the opening of the substantially ring shaped body.

In another embodiment, a processing chamber is disclosed herein. The processing chamber includes a chamber body, a substrate support assembly, and an exhaust module. The chamber body defines a processing region and is configured to generate a plasma therein. The substrate support assembly is disposed in the processing region. The exhaust module includes a body, a pumping ring, and a symmetric flow valve. The body has a first vacuum pump opening and a second vacuum pump opening formed therethrough. The pumping ring is positioned in the body over both the first and second vacuum pump openings. The pumping ring includes a substantially ring shaped body having a top surface, a bottom surface, and an opening. The top surface has one or more through holes formed therein. The one or more through holes are arranged in a pattern concentric with the first vacuum pump opening. The bottom surface has a fluid passage formed therein. The fluid passage interconnects each of the one or more through holes. The opening is formed in the substantially ring shaped body. The opening is substantially aligned with the vacuum pump opening. The symmetric flow valve is positioned in the body over the pumping ring. The symmetric flow valve is movable between a raised position allowing for passage through the opening of the substantially ring shaped body and into the vacuum pump opening and a lowered position substantially sealing the opening of the substantially ring shaped body.

In another embodiment, a method of processing a substrate in a processing chamber is disclosed herein. A plasma is formed above a substrate positioned on a substrate support assembly in the processing chamber. A symmetric flow valve in an exhaust module of the processing chamber is set in a raised position upon determining that a pressure in the processing chamber is below a pressure threshold of a vacuum pump contained therein. It is determined whether the pressure in the processing chamber exceeds the pressure threshold of the vacuum pump. Responsive to determining that the pressure in the processing chamber exceeds the threshold of the vacuum pump, the vacuum pump is sealed off and fluid is directed inside the processing chamber to a second vacuum pump opening in the exhaust module.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3A is a top view of the pumping ring of the exhaust module of FIG. 1, according to one embodiment.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
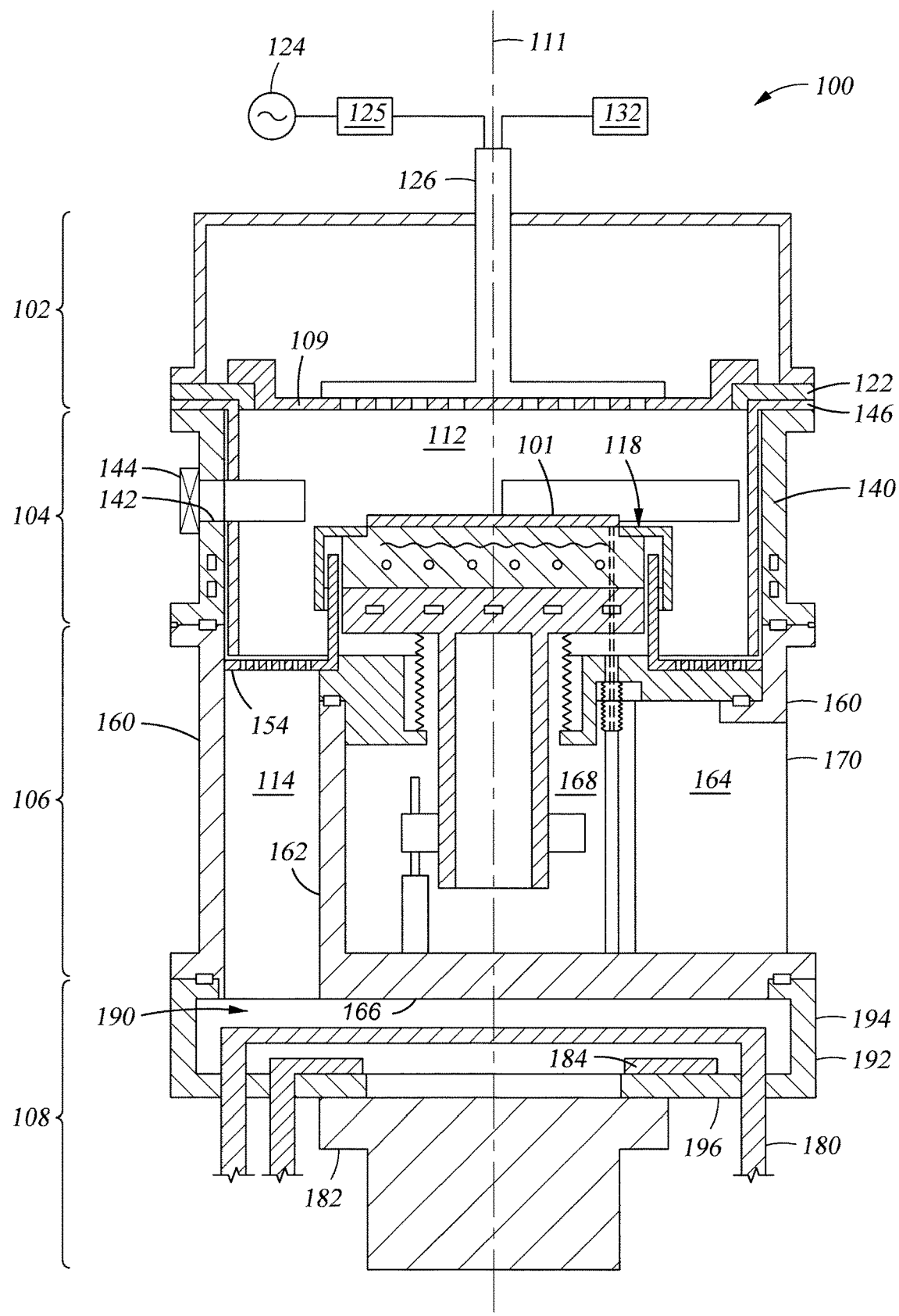
FIG. 1 is a cross sectional view of a processing chamber, according to one embodiment.

FIG. 1 is a schematic sectional view of a plasma processing chamber 100, according to one embodiment of the present disclosure. The plasma processing chamber 100 may be a plasma etch chamber, a plasma enhanced chemical vapor deposition chamber, a physical vapor deposition chamber, a plasma treatment chamber, an ion implantation chamber, or other suitable vacuum processing chamber.

The plasma processing chamber 100 may be assembled from multiple modules. The modular design enables the plasma processing chamber to meet various process requirements. As shown in FIG. 1, the plasma processing chamber 100 may include a source module 102, a process module 104, a flow module 106, and an exhaust module 108. A more detailed description of the exhaust module 108 may be had with reference to FIG. 2 and the exhaust module described therein.

During operation, a substrate 101 may be positioned on a substrate support assembly 118 and exposed to a process environment, such as plasma generated in a process region 112. Exemplary processes which may be performed in the plasma processing chamber 100 may include etching, chemical vapor deposition, physical vapor deposition, implantation, plasma annealing, plasma treating, abatement, or other plasma processes. Vacuum may be maintained in the process region 112 by suction from the exhaust module 108 through evacuation channels 114 defined by the flow module. The process region 112 and the evacuation channels 114 are substantially symmetric about a central axis 111 to provide symmetrical electrical current, gas flow, and thermal profile to establish uniform process conditions.

In one embodiment, as shown in FIG. 1, the source module may 102 may be a capacitively coupled plasma source configured to generate one or more plasmas, at least one of which may be considered a remote plasma and one of which may be considered a direct plasma. The source module 102 may include plate stack 109, which may function as an electrode (e.g., an anode), isolated and supported by the process module 104 by an isolator 122. The plate stack 109 may include various showerheads, diffusers, and screen/blocker plates arranged in a stacked orientation. The plate stack 109 may be connected to a gas source 132 through a gas inlet tube 126. The plate stack 109 and the gas inlet tube 126 may be all fabricated from a radio frequency (RF) conductive material, such as aluminum or stainless steel. The plate stack 109 may be coupled to an RF power source 124 via the conductive gas inlet tube 126. An RF matching network 125 may also be coupled to the RF power source 124. The conductive gas inlet tube 126 may be coaxial with the central axis 111 of the plasma processing chamber 100 so that both RF power and processing gases are symmetrically provided.

The process module 104 is coupled to the source module 102. The process module 104 may include a chamber body 140 enclosing the process region 112. The chamber body 140 may be fabricated from a conductive material resistive to processing environments, such as aluminum or stainless steel. The substrate support assembly 118 may be centrally disposed within the chamber body 140 and positioned to support the substrate 101 in the process region 112 symmetrically about the central axis 111.

A slit valve opening 142 may be formed through the chamber body 140 to allow passages of the substrate 101. A slit valve 144 may be disposed outside the chamber body 140 to selectively open and close the slit valve opening 142.

In one embodiment, an upper liner assembly 146 may be disposed within an upper portion of the chamber body 140, shielding the chamber body 140 from the process environment. The upper liner assembly 146 may be constructed from a conductive, process compatible material, such as aluminum, stainless steel, ceramic, and/or yttria (e.g., yttria coated aluminum).

The flow module 106 is attached to the process module 104. The flow module 106 provides flow paths between the process region 112 defined in the process module 104 and the exhaust module 108. The flow module 106 also provides an interface between the substrate support assembly 118 and the atmospheric environment exterior to the plasma processing chamber 100.

The flow module 106 includes an outer wall 160, an inner wall 162, two or more pairs of radial walls 164 connecting between the inner wall 162 and the outer wall 160, and a bottom wall 166 attached to the inner wall 162 and the two or more pairs of radial walls 164. The outer wall 160 may include two or more through holes 170 formed between each pair of radial walls 164. A chassis 154 may be sealingly disposed over the inner wall 162 and the two or more pairs of radial walls 164. The through holes 170 connect an atmosphere volume 168 defined by the inner wall 162 with the exterior environment, thus accommodating utility connections, such as electrical connection, gas connection, cooling fluid connection.

The outer wall 160 of the flow module 106 is shaped to match the chamber body 140 of the process module 104. The inner wall 162, bottom wall 166, radial walls 164, and the chassis 154 divide the volume inside the outer wall 160 into the evacuation channels 114 and the atmosphere volume 168. The evacuation channels 114 connect with the process region 112 of the process module 104. The evacuation channels 114 are symmetrically defined between the radial walls 164 to connect the process region 112 and the interior volume 190.

The exhaust module 108 includes a body 192 having sidewalls 194 and a bottom 196. The sidewalls 194 and bottom 196 define an interior volume 190. The exhaust module 108 further includes a symmetric flow valve 180, a pumping ring 184, and a vacuum pump 182. The pumping ring 184 and the symmetric flow valve 180 are disposed within the interior volume 190 of the exhaust module 108. The exhaust module 108 may be discussed in more detail in conjunction with FIGS. 2-4B. The vacuum pump 182 may be a symmetric turbo molecular pump in certain embodiments. The symmetric flow valve 180 connects to the evacuation channels 114 to provide symmetric and uniform flow in the plasma processing chamber 100.

Figure 2A:
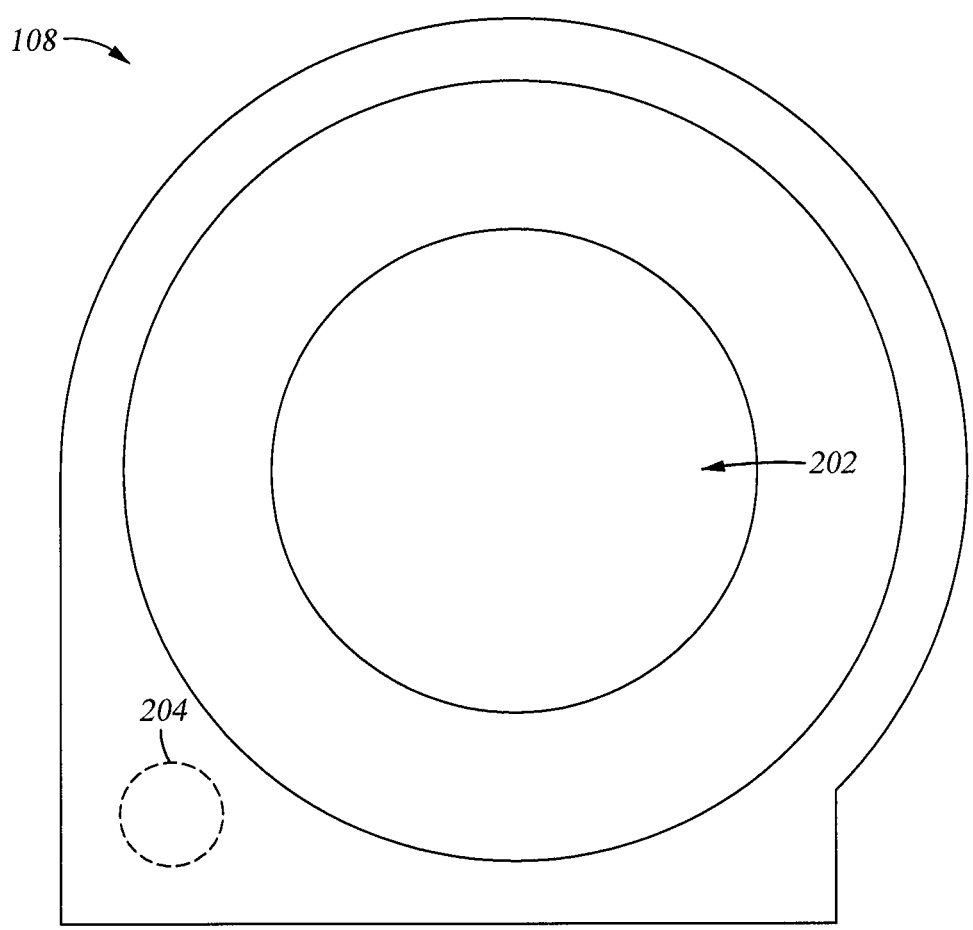
FIG. 2A is a top view of the exhaust module of the processing chamber of FIG. 1, according to one embodiment.

FIG. 2A illustrates a top view of the exhaust module 108, according to one embodiment. FIG. 2A depicts a top view of the exhaust module 108 without the pumping ring 184 and the symmetric flow valve 180 disposed therein. As illustrated, the exhaust module 108 includes two openings: a first vacuum pump opening 202 and a second vacuum pump opening 204. The first vacuum pump opening 202 and the second vacuum pump opening 204 are formed in the bottom 196 of the exhaust module 108. The first vacuum pump opening 202 is configured to provide fluid communication between the evacuation channels 114 and the vacuum pump 182. The first vacuum pump opening 202 is configured to operate at pressures between 1 mTorr and 4 Torr. The first vacuum pump opening 202 is concentric with central axis 111 of the processing chamber 100. As such, gas flows symmetrically into the first vacuum pump opening 202. The second vacuum pump opening 204 is configured to provide fluid communication between the evacuation channels 114 and a foreline connected to the second vacuum pump opening 204. The second vacuum pump opening 204 is configured to operate between 0.5 Torr and 760 Torr (1 atm). Control of the symmetric flow valve 180 in conjunction with the pumping ring 184 controls whether the gas flows towards the second vacuum pump opening 204 or towards the first vacuum pump opening 202.

Figure 2B:
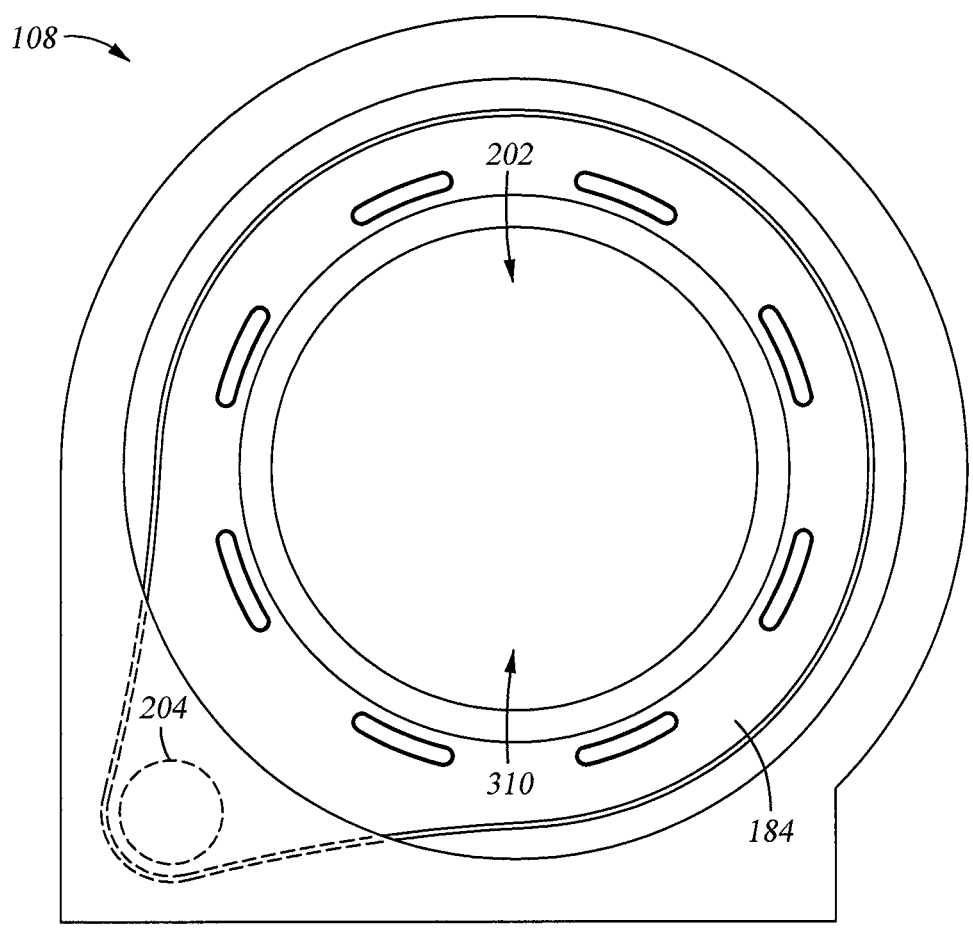
FIG. 2B is a top view of the exhaust module of the processing chamber of FIG. 1, according to one embodiment.

FIG. 2B illustrates a top view of the exhaust module 108, according to another embodiment. As illustrated, the pumping ring 184, as positioned in the exhaust module 108, is shown in FIG. 2B. The pumping ring 184 is positioned in the exhaust module 108 over both the first vacuum pump opening 202 and the second vacuum pump opening 204. A more detailed discussion of the pumping ring 184 is discussed below in conjunction with FIGS. 3A and 3B.

Figure 3B:
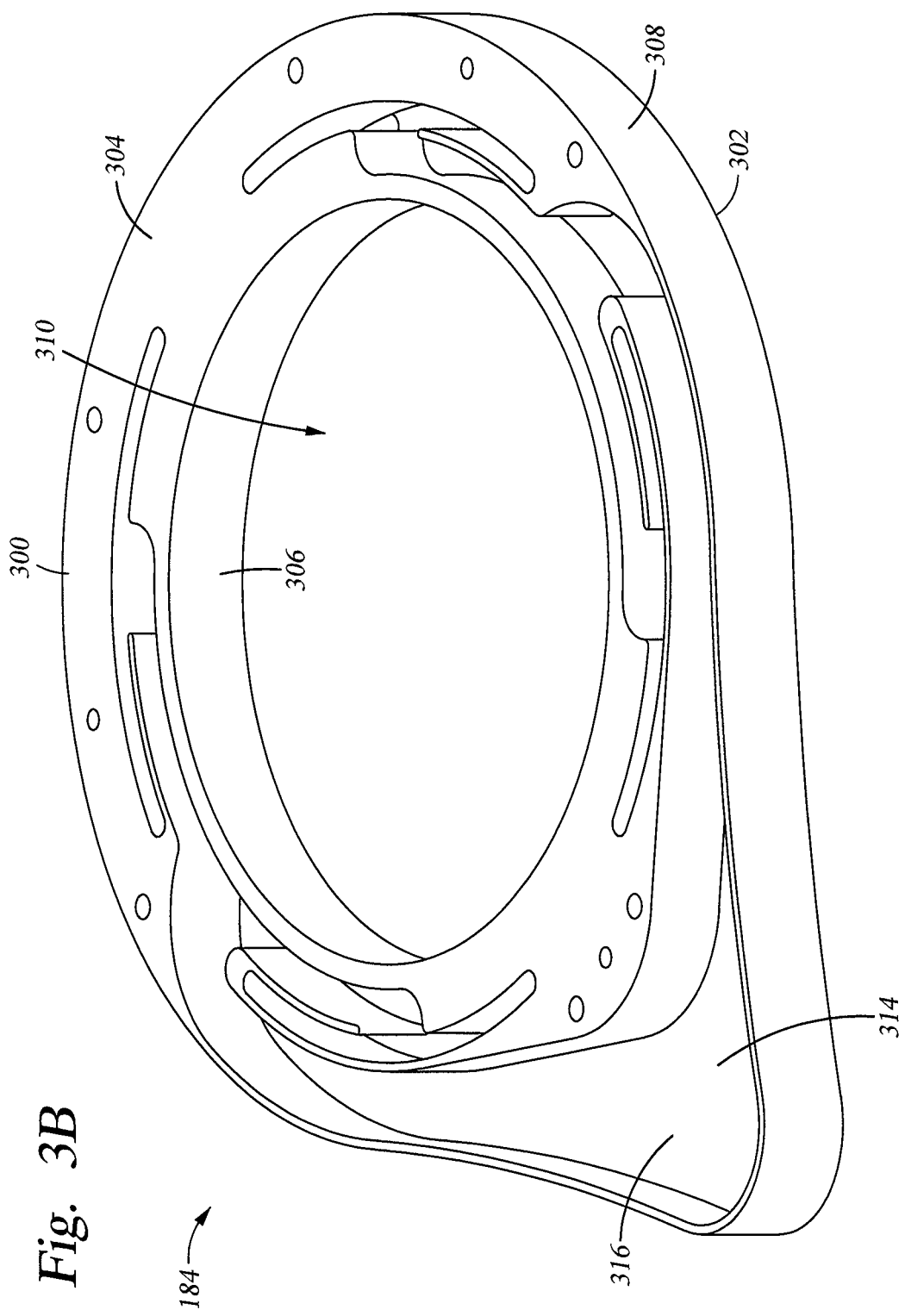
FIG. 3B is a bottom view of the pumping ring of the exhaust module of FIG. 1, according to one embodiment.

FIGS. 3A and 3B illustrate the pumping ring 184 in more detail. The pumping ring 184 includes a substantially ring shaped body 300. The ring shaped body 300 includes a top surface 302, a bottom surface 304, an inner wall 306, and an outer wall 308. The ring shaped body 300 includes an opening 310 formed therethrough. In some embodiments, the opening 310 has a diameter, D, substantially equal to a diameter of the first vacuum pump opening 202. The pumping ring 184 further includes a plurality of through holes 312. Each of the plurality of through holes 312 is formed through the ring shaped body 300, extending from the top surface 302 and the bottom surface 304. The plurality of through holes 312 is arranged in a pattern that is concentric with the first vacuum pump opening 202 about the central axis 111. In one embodiment, each through hole 312 is substantially circular. In another embodiment, each through hole 312 is slit shaped. In another embodiment, the through hole 312 may be an arc segment. Generally, the larger the area of the through hole 312, the less pressure drop across the opening 310. As such, each through hole 312 may be sized and shaped accordingly. Each through hole 312 is in fluid communication with a fluid passage 314 formed in the bottom surface 304 of the ring shaped body. The fluid passage 314 interconnects the one or more through holes 312 to collect the fluid flowing therethrough. In some embodiments, the fluid passage 314 is formed such that fluid is collected therein symmetrically about the substantially ring shaped body 300. For example, in some embodiments, the fluid passage 314 may be formed in the substantially ring shaped body 300 such that the fluid passage 314 is symmetric about a longitudinal axis 390 of the substantially ring shaped body 300. In other embodiments, the fluid passage 314 is asymmetric about the longitudinal axis 390.

The plurality of through holes 312 in the pumping ring 184 has the effect of an additional pump inlet that is split among multiple, smaller inlets within the processing chamber 100, such that, collectively, the plurality of through holes 312 is arranged concentrically along the central axis 111. This concentric pattern gives the effect of the second vacuum pump opening 204 being arranged concentric along the central axis 111, without requiring additional space in the exhaust module 108. As such, the flow conductance between each of the through holes 312 and the second vacuum pump opening 204 is equal, thus forming a fully recursive pumping ring 184. The fully recursive pumping ring 184 allows the system to maintain a concentric gas flow about the central axis 111, while utilizing the second vacuum pump opening 204 across different flows and pressures within the processing chamber 100. Additionally, the size and shape of both the through holes 312 and the fluid passage 314 may be modified to adjust the conductance to equalize the flow of gas therethrough. The major advantage of such a configuration is the minimization of non-concentric flow non-uniformity within the processing chamber 100 because it has become increasingly difficult to compensate for non-concentric non-conformities (e.g., azimuthal skew or, just skew). Such minimization can result in near complete uniform performance in etching or deposition processes from a reactor.

In these embodiments, fluid is collected symmetrically in the fluid passage 314 by selectively positioning and forming each through hole 312. As such, position, shape, and size of each through hole 312 in conjunction with the shape of the fluid passage 314 can dictate the flow of fluid from the top surface 302 of the ring shaped body 300 through the through holes 312 and into to the fluid passage 314 formed in the bottom surface 304. Thus, the through holes 312 and the fluid passage 314 act in conjunction to balance the flow of fluid towards the second vacuum pump opening 204.

The substantially ring shaped body 300 further includes an extended portion 316 projected outward from the diameter defined by the outer wall 308. The extended portion 316 of the ring shaped body 300 extends over the second vacuum pump opening 204. The fluid passage 314 formed in the bottom surface 304 of the ring shaped body 300 direct the fluid flowing therein towards the extended portion 316, such that the fluid is directed into the second vacuum pump opening 204. For example, the fluid flows through the through holes 312 and is routed through fluid passage 314, such that the fluid collects at the extended portion 316 and exits via the second vacuum pump opening 204.

The ring shaped body 300 may further include a step 320 formed in the inner wall 306. The step 320 includes a receiving surface 322 substantially parallel to the top surface 302. The receiving surface 322 is configured to receive the symmetric flow valve 180 when the symmetric flow valve 180 is placed in a lower positioned (discussed in more detail in FIG. 4B).

The ring shaped body 300 may be formed from a material that is chemically compatible with the processing parameters. For example, the ring shaped body 300 may be formed from stainless steel, aluminum, a ceramic, or the like.

Figure 2C:
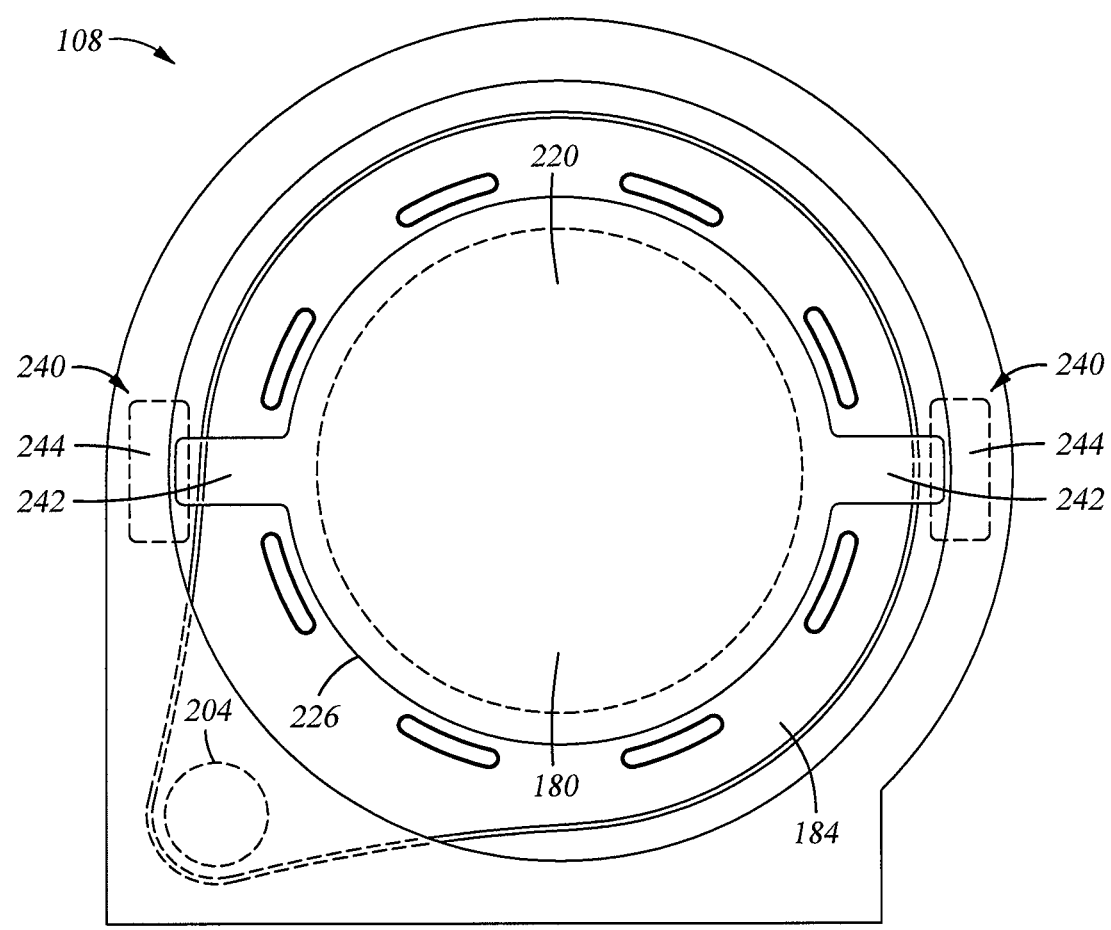
FIG. 2C is a top view of the exhaust module of the processing chamber of FIG. 1, according to one embodiment.

FIG. 2C is a top view of the exhaust module 108, according to another embodiment. As illustrated, both the pumping ring 184 and the symmetric flow valve 180 are positioned in the exhaust module 108 in FIG. 2C. The symmetric flow valve 180 is positioned over the pumping ring 184 and the first vacuum pump opening 202. The symmetric flow valve 180 is substantially aligned with the opening 310 formed in the pumping ring 184. In one embodiment, the symmetric flow valve 180 has a diameter D2 that is substantially equal to the diameter, D, of the opening 310. As such, the symmetric flow valve 180 may be lowered into the opening 310 such that the symmetric flow valve 180 prevents fluid from flowing into the opening 310 and down into the first vacuum pump opening 202

The symmetric flow valve 180 generally includes a disc shaped body 220. The disc shaped body 220 includes a top surface 222 and a bottom surface 224. One or more seals 228 may be coupled to the bottom surface 224 of the disc shaped body 220 along a perimeter 226 of the disc shaped body 220. The one or more seals 228 aid in fluidly sealing the evacuation channels 114 from the opening 310 of the ring shaped body and the first vacuum pump opening 202. In embodiments where the ring shaped body 300 includes the step 320, the one or more seals 228 contact the receiving surface 322 formed by the step.

The symmetric flow valve 180 may further include at least one actuating assembly 240. Each actuating assembly 240 includes at least an actuator 244. In some embodiments, the actuating assembly 240 may further include an interface mechanism 242. The interface mechanism 242 may be, for example, an arm, mounting tab, or the like. The interface mechanism 242 may be coupled to the disc shaped body 220. The interface mechanism 242 may extend through the exhaust module 108 such that the arm extends outside the processing chamber 100. The interface mechanism 242 is coupled to the actuator 244. The actuator 244 is configured to move the interface mechanism 242 vertically, such that the symmetric flow valve 180 can seal off the opening 310 of the pumping ring 184.

In other embodiments, the symmetric flow valve 180 may include greater than one actuating assembly 240. When there are more than one actuating assembly 240, the actuating assemblies 240 may be positioned evenly about the circumference of the disc shaped body. For example, in the case where there are three actuating assemblies 240, each actuating assembly may be positioned at about the 120, 240, and 360 degree points along the circumference of the disc shaped body 220. In the case where there are two actuating assemblies 240, each actuating assembly may be positioned at about the 0 and 180 degree points along the circumference of the disc shaped body 220. Generally, there may be N actuating assemblies 240 for the symmetric flow valve 180.

Figure 4A:
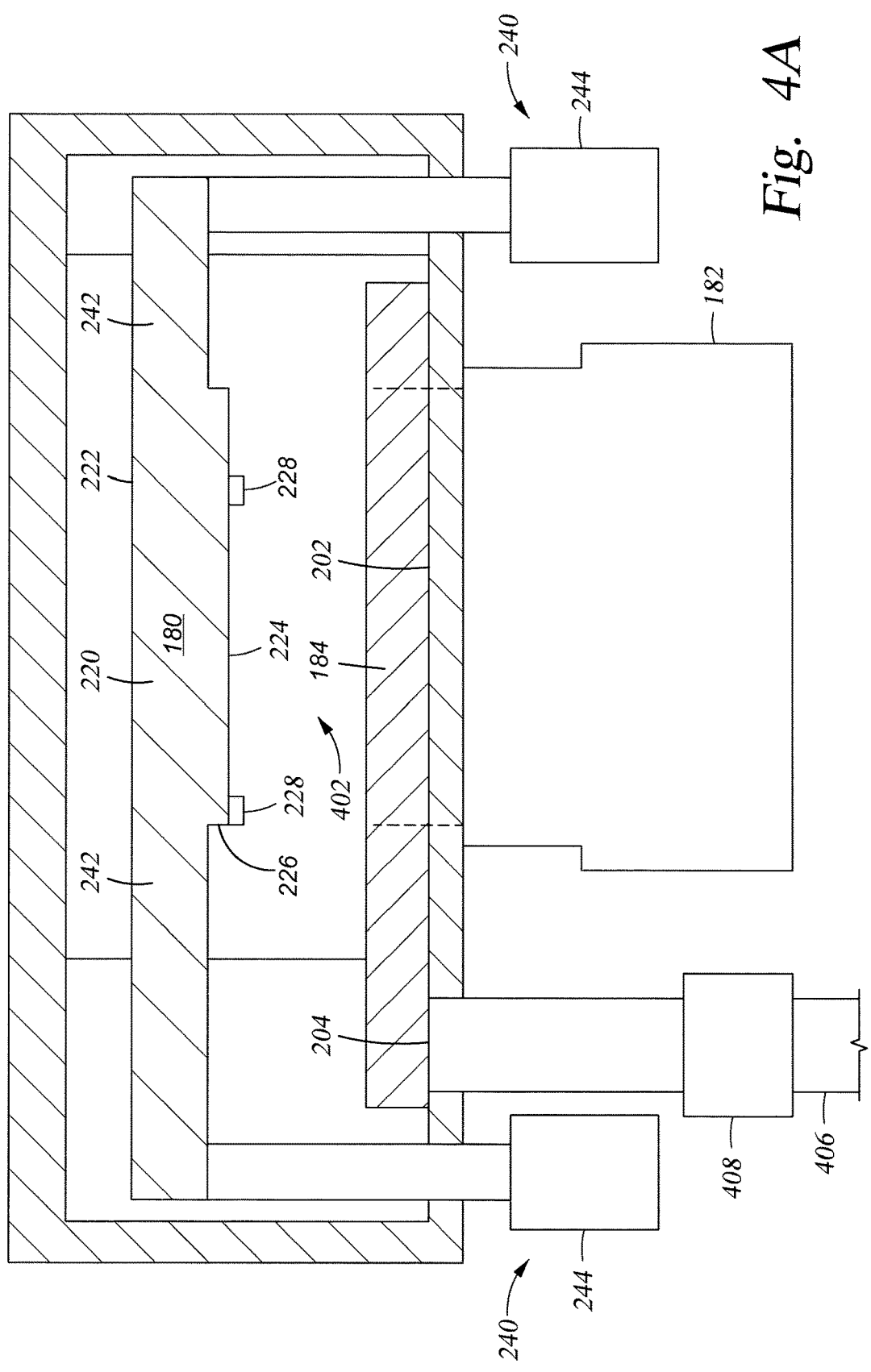
FIG. 4A is a cross-sectional view of the exhaust module of FIG. 1 when the symmetric flow valve is in a raised position, according to one embodiment.

FIG. 4A is a cross-sectional view of the exhaust module 108, according to one embodiment. In the embodiment shown in FIG. 4A, the symmetric flow valve 180 is in a raised position 402. In the raised position, the symmetric flow valve 180 functions as a conventional symmetric flow valve. Fluid from the evacuation channels 114 is directed into the exhaust module 108. From the exhaust module 108, the fluid is directed through the first vacuum pump opening 202 and into the vacuum pump 182. In conventional processing chambers, however, high pressure operations are limited by the symmetric flow valve tolerances and maximum pump inlet pressure/flow. As a result, there is inconsistent symmetric flow valve leak-by, which can lead to inconsistent control at processing high pressures.

Figure 4B:
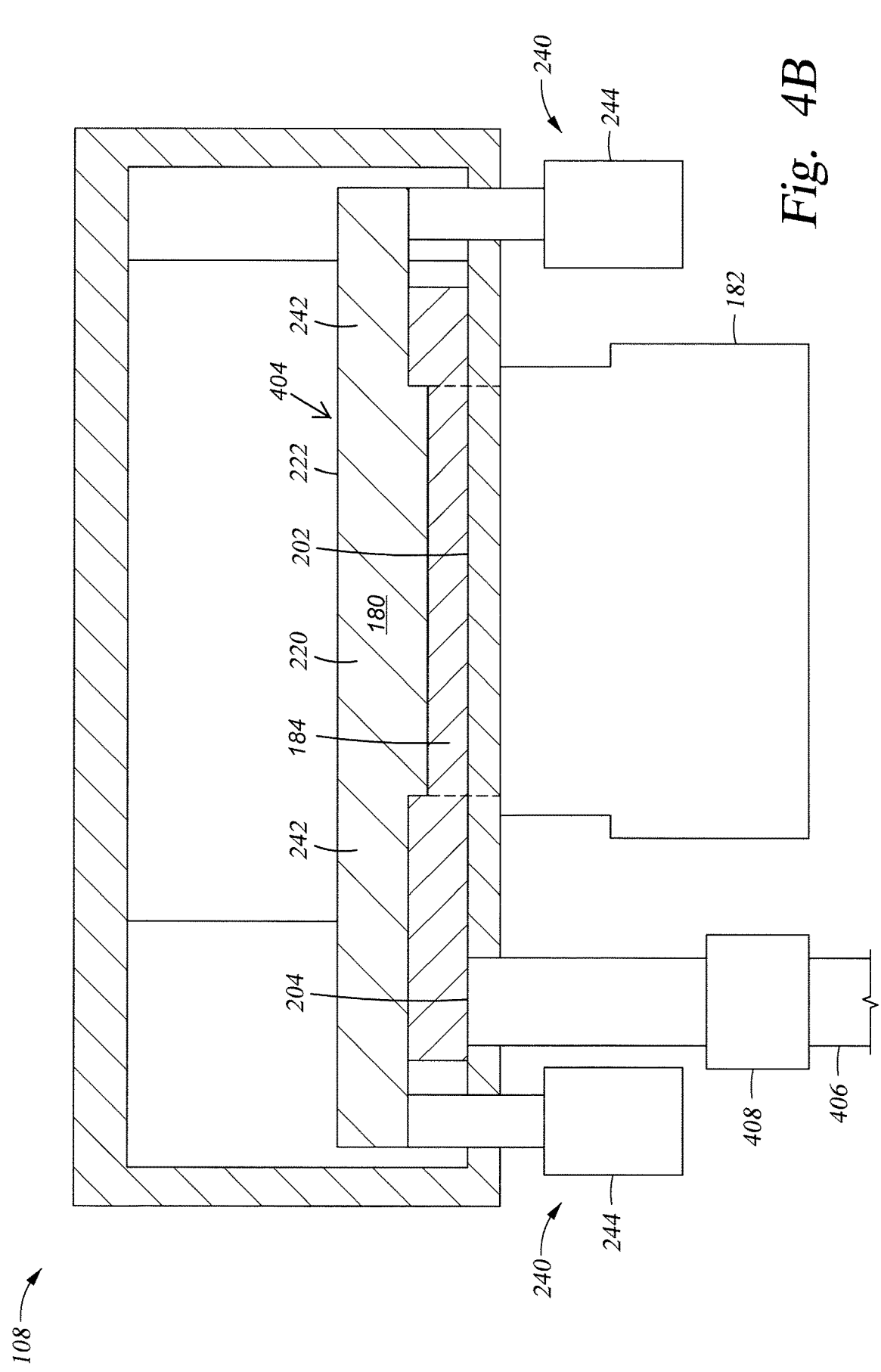
FIG. 4B is a cross-sectional view of the exhaust module of FIG. 1 when the symmetric flow valve is in a lowered position, according to one embodiment.

The addition of the pumping ring 184 to the exhaust module 108 creates a symmetric turbo pump bypass that better controls exhaust during high pressure operation of the processing chamber 100. For example, FIG. 4B is a cross sectional view of the exhaust module 108, according to one embodiment. In the embodiment shown in FIG. 4B, the symmetric flow valve 180 is in a lowered position 404. The symmetric flow valve 180 is moved into the lowered position 404 when the processing chamber 100 is operating at a high pressure. For example, the symmetric flow valve 180 is moved into the lowered position 404 when the processing chamber 100 is operating at a pressure greater than about 1 Torr. Generally, the symmetric flow valve 180 is moved into the lowered position 404 when the pressure in the chamber exceeds the tolerance allowed by the turbo pump. In the lowered position 404, the opening 310 of the pumping ring 184 is sealed by the symmetric flow valve 180. As such, the first vacuum pump opening 202 is isolated from the evacuation channels 114. The fluid entering the exhaust module 108 is thus forced through the one or more through holes 312 and into the fluid passage 314. The fluid passage 314 is in communication with the second vacuum pump opening 204. Thus, when the symmetric flow valve 180 is in the lowered position 404, the fluid from the evacuation channels 114 is directed into the second vacuum pump opening 204.

As illustrated in both FIGS. 4A and 4B, a foreline 406 is coupled to the second vacuum pump opening 204. The foreline 406 may include a flow control mechanism 408 coupled therein. The flow control mechanism 408 is configured to control the flow of fluid into the foreline 406. In some embodiments, the flow control mechanism 408 may be a throttle (butterfly) valve.

While the foregoing is directed to specific embodiments, other and further embodiments may be devised without departing from the basic scope thereof, and the scope thereof is determined by the claims that follow.

What is claimed is:

1. An exhaust module for a processing chamber, comprising a body having a first vacuum pump opening and a second vacuum pump opening formed therethrough;

a pumping ring positioned in the body over both the first and second vacuum pump openings, the pumping ring comprising:

a substantially ring shaped body, comprising:

a top surface and a bottom surface, the top surface having one or more through holes formed therein, wherein the one or more through holes are arranged in a pattern concentric with the first vacuum pump opening and the bottom surface having a fluid passage formed therein fluidly isolated from the first vacuum pump opening, the fluid passage interconnecting each of the one or more through holes to the second vacuum pump opening; and an opening formed in the substantially ring shaped body, the opening substantially aligned with the first vacuum pump opening; and a symmetric flow valve positioned in the body over the pumping ring, the symmetric flow valve movable between a raised position allowing for passage through the opening of the substantially ring shaped body and into the vacuum pump opening and a lowered position substantially sealing the opening of the substantially ring shaped body without sealing the one or more through holes.

2. The exhaust module of claim 1, wherein the substantially ring shaped body further comprises:

an extended portion positioned over the second vacuum pump opening, wherein the fluid passage extends into the extended portion.

3. The exhaust module of claim 1, wherein the symmetric flow valve comprises:

a disc shaped body, wherein the disc shaped body has a diameter substantially equal to a diameter of the opening formed in the substantially ring shaped body.

4. The exhaust module of claim 3, wherein the symmetric flow valve further comprises:

one or more actuator assemblies, wherein each actuator assembly comprises:

an arm coupled to the disc shaped body; and an actuator coupled to the arm, the actuator configured to move the disc shaped body in a vertical direction.

5. The exhaust module of claim 4, wherein each of the one or more actuator assemblies are positioned is an array about the disc shaped body.

6. The exhaust module of claim 1, wherein the substantially ring shaped body further comprises:

an inner wall and an outer wall and;

a step formed in the inner wall, wherein the step defines a receiving surface configured to receive the symmetric flow valve when the symmetric flow valve is placed in a lowered position.

7. The exhaust module of claim 1, wherein the exhaust module includes a body having sidewalls and a bottom, wherein the opening is formed in the bottom of the body.

8. The exhaust module of claim 1, wherein each of the through holes is circular shaped.

9. The exhaust module of claim 1, wherein each of the through holes is slit shaped.

10. A processing chamber comprising:
a chamber body defining a processing region and configured to generate a plasma therein;
a substrate support assembly disposed in the process region; and
an exhaust module comprising:
a body coupled to the chamber body, the body having a first vacuum pump opening and a second vacuum pump opening formed therethrough;
a pumping ring positioned in the body over both the second vacuum pump opening and the vacuum pump opening, the pumping ring comprising:
a substantially ring shaped body, comprising:
a top surface and a bottom surface, the top surface having one or more through holes formed therein, wherein the one or more through holes are arranged in a pattern concentric with the first vacuum pump opening and the bottom surface having a fluid passage formed therein fluidly isolated from the first vacuum pump opening, the fluid passage interconnecting each of the one or more through holes to the second vacuum pump opening; and
an opening formed in the substantially ring shaped body, the opening substantially aligned with the first vacuum pump opening; and
a symmetric flow valve positioned in the body over the pumping ring, the symmetric flow valve movable between a raised position allowing for passage through the opening of the substantially ring shaped body and into the vacuum pump opening and a lowered position substantially sealing the opening of the substantially ring shaped body without sealing the one or more through holes.

11. The processing chamber of claim 10, wherein the substantially ring shaped body further comprises:
an extended portion positioned over the second vacuum pump opening, wherein the fluid passage extends into the extended portion.

12. The processing chamber of claim 10, wherein the symmetric flow valve comprises:
a disc shaped body, wherein the disc shaped body has a diameter substantially equal to a diameter of the opening formed in the substantially ring shaped body.

13. The processing chamber of claim 10, wherein the symmetric flow valve further comprises:
one or more actuator assemblies, wherein each actuator assembly comprises:
an arm coupled to the disc shaped body; and
an actuator coupled to the arm, the actuator configure to move the disc shaped body in a vertical direction.

14. The processing chamber of claim 13, wherein each of the one or more actuator assemblies are positioned is an array about the disc shaped body.

15. The processing chamber of claim 10, wherein the substantially ring shaped body further comprises:
an inner wall and an outer wall and;
a step formed in the inner wall, wherein the step defines a receiving surface configured to receive the symmetric flow valve when the symmetric flow valve is placed in a lowered position.

16. The processing chamber of claim 10, wherein the exhaust module includes a body having sidewalls and a bottom, wherein the opening is formed in the bottom of the body.

17. The processing chamber of claim 10, further comprising:
a foreline coupled to the second vacuum pump opening and a symmetric turbo molecular pump coupled to the vacuum pump opening.

18. The processing chamber of claim 17, wherein the foreline comprises:
a flow control mechanism configured to control a flow of fluid into the foreline.

19. The processing chamber of claim 18, wherein the flow control mechanism is a butterfly valve.

* * * * *